United States Patent [19]

Sukegawa et al.

[11] Patent Number: 4,944,811
[45] Date of Patent: Jul. 31, 1990

[54] MATERIAL FOR LIGHT EMITTING ELEMENT AND METHOD FOR CRYSTAL GROWTH THEREOF

[75] Inventors: Tokuzo Sukegawa, Hamamatsu; Kazuyuki Tadatomo, Itami, both of Japan

[73] Assignees: Tokuzo Sukegawa, Shizuoka; Mitsubishi Cable Industries, Ltd., Hyogo, both of Japan

[21] Appl. No.: 391,391

[22] Filed: Aug. 9, 1989

Related U.S. Application Data

[63] Continuation of Ser. No. 71,254, Jul. 8, 1987, abandoned.

[30] Foreign Application Priority Data

| Jul. 16, 1986 | [JP] | Japan | 61-167504 |
| Jul. 16, 1986 | [JP] | Japan | 61-167505 |
| Jul. 16, 1986 | [JP] | Japan | 61-167506 |
| Jul. 16, 1986 | [JP] | Japan | 61-167507 |
| Jul. 16, 1986 | [JP] | Japan | 61-167508 |

[51] Int. Cl.$^5$ .............. H01L 21/20; H01L 21/208; H01L 29/00; H01L 29/06
[52] U.S. Cl. .................. 148/33.1; 148/33; 148/33.4; 148/33.5; 148/33.6; 148/DIG. 65; 148/DIG. 66; 148/DIG. 67; 148/DIG.99; 148/DIG. 119; 437/23; 437/127; 437/130; 437/133; 437/904; 437/905
[58] Field of Search ............ 148/33, 33.1, 33.4, 148/33.5, 33.6, DIG. 56:DIG. 65, DIG. 66, DIG. 67, DIG. 99, DIG. 101, DIG. 119; 437/23, 92, 127, 129, 130, 133, 904, 905

[56] References Cited

U.S. PATENT DOCUMENTS

| 3,614,549 | 10/1971 | Lorenz et al. | 437/905 |
| 3,899,371 | 8/1975 | Ladany et al. | 437/133 |

OTHER PUBLICATIONS

Blood et al., "GaInP Grown by Molecular Beam Epitaxy Doped With Be and Sn", J. Appl. Phys., vol. 53, No. 4, Apr. 1984, pp. 3145-3149.
Logan et al., "Electroluminescence in $GaAs_xP_{1-x}$, $In_xGa_{1-x}P$, and $Al_xGa_{1-x}P$ Junctions With $X \leq 0.01$", J. Appl. Phys., vol. 42, No. 6, May 1971, pp. 2328-2335.
Craford et al., "LED Technology", Solid State Technology, Jan. 1974, pp. 39-58.

Primary Examiner—Brian E. Hearn
Assistant Examiner—M. Wilczewski
Attorney, Agent, or Firm—Wenderoth, Lind & Ponack

[57] ABSTRACT

A material for a light emitting element most suited for a light emitting diode or laser diode which emits visible light of 550 to 650 nm band wavelength. The material provides an at least two-layered structure composed of a GaAs substrate and a Sn doped InGaP layer developed on the substrate without forming a gradient layer therebetween. The mixed crystal composition of the Sn doped InGaP layer as expressed by the molar fraction of GaP is 0.50 to 0.75.

According to the method for developing mixed crystals of InGaP, GaP and InP are dissolved in Sn to make a solution. The solution is allowed to come in contact with a GaAs substrate so that InGaP crystals are developed directly on the GaAs substrate without a gradient layer for coordinating the lattice constant formed on the GaAs substrate.

4 Claims, 4 Drawing Sheets

COMPOSITION (MOLAR FRACTION)

MATERIAL FOR LIGHT EMITTING ELEMENT AND METHOD FOR CRYSTAL GROWTH THEREOF

This application is a continuation of now abandoned application Ser. No. 071,254, filed Jul. 8, 1987, now abandoned.

BACKGROUND OF THE INVENTION

1. [Field of the Invention]

The present invention relates to a material for a light emitting element suitable for a light source for plastic optical fiber communication or more specifically to a material for a light emitting element suitable for a light emitting diode (LED) or a laser diode emitting visible light of 550 to 650 nm band wavelength, and also relates to a method of developing mixed crystals of indium gallium phosphide directly on the GaAs-substrate, the III-V group compound, which method is a crystal growth technique in processing a compound semiconductor, for use in manufacturing the above material.

2. [Description of the Prior Art]

Figure 9:
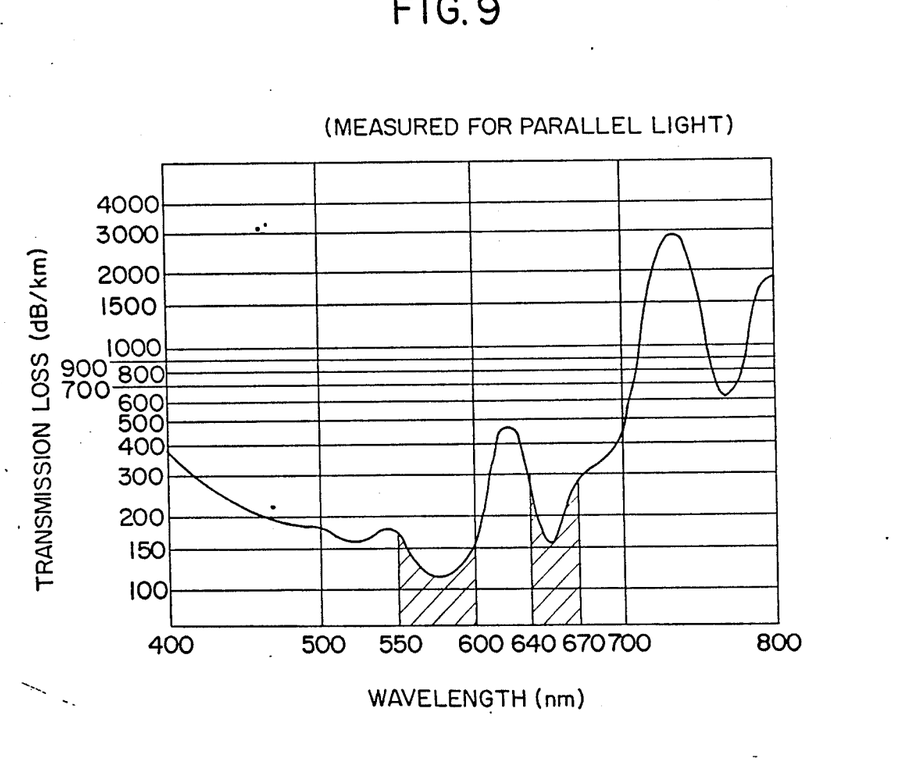
FIG. 9 is a graph showing the relationship between the wavelength and the transmission loss for a plastic optical fiber.

Generally, optical communication involves a plastic optical fiber whose core is composed of methyl polymethacrylate (PMMA) and whose clad is composed of, say, fluorine (F) introduced in the molecular chain of methyl polymethacrylate of lower transmission loss. It is conventionally known that the plastic optical fiber of the above structure provides conspicuously low transmission loss, as shown in FIG. 9, in the 640 to 670 nm wavelength region (hereinafter called 660 nm band wavelength [shaded portion in FIG. 9]) and in the 550 to 600 nm wavelength region (hereinafter called 570 nm band wavelength[.shaded portion in FIG. 9]). The transmission loss is 150 to 280 dB/km for the 660 nm band wavelength, and 120 to 170 dB/km for the 570 nm band wavelength.

In the GaInP system, this light emitting wavelength has a specific correlation to the molar fraction x of GaP in GaInP. The 550 nm and 600 nm wavelengths correspond to the molar fractions of 0.74 and 0.63, respectively, as explained below.

The relationship as expressed by the following equation between light emmitting wavelength of LED ($\lambda p$) and bandgap ($E_g$) is evidenced by the equation 5.1-1 on page 4 of HETEROSTRUCTURE LASERS, H.C. Casey, Jr. et al., PART B, ACADEMIC PRESS, New York, 1978.

$$E_g(eV) = \frac{1.2398}{\lambda_p(um)} \quad (1)$$

On the other hand, the relationship as expressed by the following equation between $E_g$ and the molar fraction of x of GaP in $Ga_xIn_{1-x}P$ is evidenced by FIG. 5.3-1 on page 16, the disclosure beginning from the first line of page 20 and FIG. 5.3-6 on page 20 of the above reference.

$$E_g(eV) = 1.351 + 0.643x + 0.786x^2 \quad (0 \leq x \leq 0.74) \quad (2)$$

The bandgaps $E_g$ with respect to 550 nm (0.55 μm) and 600 nm (0.60 μm) of the wavelengths $\lambda p$ are calculated using the above equation (1) and each obtained $E_g$ value is substituted in the equation (2) to give the molar fraction x. The results are summarized below.

| Wavelength $\lambda_p$ (nm) | Bandgap $E_g$ (eV) | Molar Fraction x |
|---|---|---|
| 550 | 2.257 | 0.74 |
| 600 | 2.068 | 0.63 |

The width of the low transmission loss region is broader for the 570 nm band wavelength than for the 660 nm band wavelength. Namely, considering that light emitting wavelength of LEDs has a distribution, an LED of 570 nm band wavelength with broader low loss region can realize optical fiber communication with less transmission loss.

It is clear, therefore, that in optical communication with plastic optical fiber, a yellow-green LED with luminous center wavelength at 570 nm band provides less transmission loss than a red LED with luminous center wavelength at 660 nm band.

GaAsP with a direct band gap (direct transition type for the red wavelength band) and GaAlAs with a direct band gap are conventionally available red LEDs of 660 nm band wavelength. Their luminous efficacies are 0.1 to 0.2% (100 to 300μW in luminance) and 2 to 8% (500 to 2,000μW in luminance), respectively. And conventionally available green LEDs of 570 nm band wavelength are only GaP and GaAsP of indirect transition type whose luminous efficacy is very low or 0.1 to 0.2 % (25 to 50μW in luminance). So, although the conventional green LED is superior in transmission loss by the plastic optical fiber, its low luminance makes it unsuitable to optical communication.

Presently, LEDs with wavelength near 570 nm band (yellow to green) with GaAsP developed on a GaP of GaAs substrate have been sold in the market, although they are exclusively used for display. Since the GaP or GaAsP LED of indirect transition type is poor in luminous output and slow in modulation rate, it cannot be used for the same purpose as a red LED of 660 nm band wavelength. This is why it has not been put into practical use in optical communication.

In view of this, the industry has presented a green LED which is suitable for optical communication and which has overcome the disadvantage of the conventional GaP or GaAsP green LED without sacrificing the advantage of the LED of 570 nm band wavelength. This green LED uses InGaP instead of GaAsP. That is, InGaP layer is developed on a GaAs substrate. Since it has a direct band gap, it provides good luminous efficacy and high luminous output. In addition, its modulation rate is high. Accordingly, it has a wide range of applications from short distance communication by plastic optical fiber (for use in moving vehicles, houses, buildings, etc.) to character displays (large indicator lamps, large display units, etc.) to OA equipment (facsimiles, copying machines, etc.)

In-Ga-P ternary system solution is normally used in growing mixed crystals of InGaP having the same lattice constant as the GaAs substrate. However, since the lattice constant of InGaP of the composition suitable for green LEDs differs from that of the GaAs substrate, it is difficult to epitaxially grow mixed InGaP crystals for green LEDs directly on the GaAs substrate by using In-Ga-P ternary system solution. In the conventional method, therefore, it is necessary to form a GaAsP composition gradient layer for conforming the lattice constant of the GaAs substrate to that of the epitaxially grown InGaP layer.

The typical process of forming the gradient layer is as follows. Firstly, a layer of a material with the same lattice constant as a substrate is grown on the substrate. Then, a layer of material with gradually changing lattice constant is formed on the first layer until the lattice constant becomes equal to that of the epitaxially grown layer or the light emitting layer. For epitaxial growth of a light emitting InGaP layer on a GaAs substrate, a gradient layer of $GaAs_yP_{1-y}$ is formed on the substrate, with the value of "y" decreased gradually (that is, the content of P is increased gradually.), to fill up the gap of the lattice constant between the GaAs substrate and the InGaP layer.

Material for green light emitting element with $GaAs_yP_{1-y}$ gradient layer formed on a GaAs substrate is sold in the market as a material for green LED with gradient layer. Compared with the type with no gradient layer on the GaAs substrate, this commercially available material with gradient layer is expensive. Naturally, the resulting light emitting element such as LED or laser diode manufactured therefrom is expensive. Moreover, misfit dislocation due to the gradient layer deteriorates the luminance and the reliability of the element seriously.

From the viewpoint of the method of producing the above material for light emitting elements, III–V group compound InGaP, whose effective forbidden band gap can be increased by selecting appropriate alloy composition, is one of the most important materials for a compound semi-conductor, particularly when the semiconductor is to be used in a visible light region (yellow to green). However, InGaP of the composition corresponding to the visible light region has a high melting point of about 1,450° C. and its dissociation pressure at this temperature is very high or about 32 atmospheric pressure. Consequently, it is difficult to pull up the InGaP alloy-crystals from InP-GaP quasi-binarg solution by using a normal method.

As one of the methods for growing InGaP alloy crystals, epitaxial growth technique can be used, which has been well established on an industrial base. Epitaxial growth technique by which to grow a single crystal on a seed crystal substrate has two types: vapor phase epitaxial (VPE) growth technique and liquid phase growth tehnique. The former technique is for growing ex- crystals by supplying source material from a vapor phase onto a seed crystal substrate, using chemical reactions. The latter technique is for growing crystals by allowing saturated solution of source semiconductor material dissolved at a high temperature in a metal solvent to come in contact with a seed crystal substrate and then cooling it so that the source semiconductor material as a solute is supersaturated. precipitating on the seed crystal substrate. With the vapor phase growth technique, crystals of high purity and therefore of high resistance can be developed. Besides, it is possible to vary the concentration of impurities added as crystals are growing. With the liquid phase epitaxial (LPE) growth technique, on the other hand, since crystals can be developed at a low temperature, it is easy to grow crystals containing components of high vapor pressure. Besides, crystals can be grown within a short period by a simple apparatus. In addition, it is easy to obtain crystals containing large amount of impurities. Needless to say, an appropriate technique should be selected according to the purpose.

Liquid phase growth technique is suitable for growing InGaP crystals, considering its high vapor pressure around its melting point. However, it is difficult to grow, on GaAs as a seed crystal substrate, InGaP crystals of such alloy composition as to emit light in the yellow to green wavelength region. This is due to the lattice mismatch and due to the fact that the seed crystal substrate is soluble in the crystal growth solution The dissolution of the seed crystal substrate could be prevented by dissolving GaAs to saturation in addition to In, Ga and P in the metal solvent. Since the solubility of GaAs is as large as that of InGaP, however, the resulting crystal would contain considerably large quantity of GaAs, hampering the light emission in the intended wavelength region.

This problem can be solved when a solution of Sn, Ga and InP is made in contact with the GaAs substrate to grow InGaP alloy crystals on the substrate. And yet, since the solution contains smaller numbers of atoms of V group elements than the total number of atoms of III group elements, the GaAs substrate tends to be dissolved in the solution, deteriorating the quality of the resulting crystal grown layer.

Another possible method for solving the above problem is to form a GaAsP buffer layer between the GaAs substrate and the InGaP layer. This method restricts the orientation of crystal face: GaAsP can be grown only on the face (100) of the GaAs crystal orientation. Besides, since the grown InGaP crystal takes over the previously described misfit dislocation, the resulting light emitting diode cannot provide high luminance.

In view of the above, the object of the present invention is to provide a material for a light emitting element most suited for use in optical communication which material is less expensive, more economical and smaller in dislocation density than the conventional material for green light emitting elements with $GaAs_yP_{1-y}$ gradient layer formed on the GaAs substrate, and a method for crystal growth of the material.

SUMMARY OF THE INVENTION

To achieve the above object, according to an embodiment of the present invention, a material for a light emitting element provides an at least two-layered structure comprising a GaAs substrate and a Sn doped InGaP layer formed on said substrate. The mixed crystal composition of said Sn doped InGaP layer as expressed by the molar fraction of GaP is 0.50 to 0.75.

According to another embodiment of the present invention, a light emitting region including a p-n junction is provided on the Sn doped InGaP layer of the first embodiment of the invention. According to another embodiment of the present invention, a material for a light emitting element provides an at least three-layered structure comprising a donor impurity doped InGaP layer formed on the Sn-doped InGaP layer of the first embodiment. The mixed crystal composition of said donor impurity doped InGaP layer as expressed by the molar fraction of GaP is 0.50 to 0.75. According to another embodiment of the present invention, a material for a light emitting element provides an at least four-layered structure comprising a donor impurity doped InGaP layer and an acceptor impurity doped InGaP layer formed in this order on the Sn doped InGaP layer of the first embodiment. The mixed crystal composition of said donor impurity doped InGaP layer and of said acceptor impurity doped InGaP layer as expressed by the molar fraction of GaP is 0.50 to 0.75.

In all of the above embodiments, the Sn doped InGaP layer, the donor impurity doped InGaP layer and the acceptor impurity doped InGaP layer provide such mixed crystal composition that the molar fraction of GaP is 0.50 to 0.75. According to the present invention, as mentioned above, the mixed crystal composition of the Sn doped, donor impurity doped and acceptor impurity doped InGaP layers on the GaAs substrate, as expressed by the molar fraction of GaP, is 0.50 to 0.75 or preferably 0.70 to 0.74. The material of 0.70 to 0.74 in the molar fraction of GaP is superior in the luminous output and in modulation rate.

The amount of Sn doped is $10^{17}$ to $10^{19}$/cm$^3$ or preferably about $10^{18}$/cm$^3$. The amount of donor impurity is $10^{15}$ to $10^{17}$/cm$^3$ or preferably about $10^{16}$/cm$^3$. The amount of acceptor impurity is $10^{16}$ to $10^{18}$/cm$^3$ or preferably about $10^{18}$/cm$^3$.

The donor impurity to be added in the donor impurity doped InGaP layer developed on the Sn doped InGaP layer may be S, Si, Te or Se (most preferably Te). The acceptor impurity to be added in the acceptor impurity doped InGaP layer developed on the donor impurity doped InGaP layer may be Ge, Be, Cd, Mg or Zn (most preferably Zn).

The method for producing the material of any of the above embodiments is not limited. It may be produced, for instance, by using "Method for Crystal Growth of Gallium Phosphide" disclosed in the Japanese Patent Publication (Tokukosho No. 50-39079), although it is more preferable to produce it by the crystal growth method of the present invention. The crystal growth method of the present invention, in which GaP is used instead of Ga, comprises steps of dissolving GaP and InP in a Sn solvent, of allowing the resultant solution to be made in contact with the GaAs substrate, and of lowering the temperature of the solution at least in the vicinity of the contact area to make InGaP crystals grow on the substrate.

The principle of the crystal growth method of the present invention is described below. GaP and InP are dissolved in Sn, a metal solvent, and heated to a InGaP crystal-growing temperature to prepare a Sn-In-P-Ga four-component system metal solution. In preparing the above metal solution, the amount of each component is normally controlled so that InGaP is saturated or nearly saturated in the solution. In this state, In and Ga (III group elements) and P (V group element) are dissolved in the solution by the stoichiometric ratio, that is, the total number of atoms of In and of Ga dissolved is equal to that of P dissolved in the solution. In order to develop InGaP crystals containing 0.50 to 0.75 molar fraction of GaP as required for obtaining yellow to green light emission, the quantity of GaP to be dissolved may be any value selected from the range between 3 and 40 mol%, assuming that the percentage of InP and of GaP dissolved in the Sn solvent is 100% by the total mol quantity of InP and GaP.

The InGaP crystals are precipitated in the following process. The prepared solution, made in contact with the GaAs seed crystal substrate at a crystal-growing temperature, is cooled, or a temperature gradient is given to make the temperature of the seed crystal substrate lower than that of the solution. Then, InGaP is supersaturated in the solution and precipitated in form of crystals on the GaAs seed crystal substrate.

The InGaP crystals thus obtained have few lattice defects owing to the property of the crystal-growing solution in which InP and GaP are dissolved in the Sn solvent by the stoichiometrical or nearly stoichiometrical ratio, that is, in which a III group element and a V group element are dissolved 1:1 by the number of atoms. Specifically, less lattice defects in the resultant InGaP crystals are attributable to the following two reasons.

Firstly, the crystal-growth solution prevents the GaAs substrate from being dissolved. This is because the chemical equivalent ratio between III and V group elements will not change even if GaAs is dissolved in the solution and because dissolution of trace quantity of GaAs into the solution causes the solubility of InGaP in the solution to drop drastically. Namely, dissolution of the GaAs substrate triggers InGaP to precipitate, preventing further dissolution of GaAs. The principle of the crystal growth method of the present invention is thus based on the fact that GaAs is hardly dissolved in Sn solution in which InP and GaP are saturated. In contrast, In-Ga-P ternary solutions with non-stoichiometric composition are normally used to grow InGaP alloy crystals by the conventional LPE technique. Namely the content of a III group element is predominantly larger than that of a V group element. Therefore, even if the In-Ga-P ternary system solution is saturated at a crystal-growing temperature, GaAs is dissolved when it is made in contact with the solution.

Secondly, the cystal growth solution in which InP and GaP are saturated in the Sn solvent compensates the lattice mismatching between the GaAs substrate and the InGaP-growing layer by an unknown mechanism.

Figure 6:
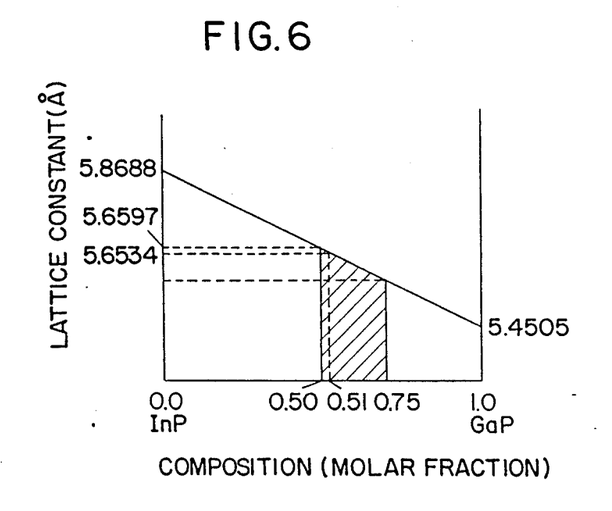
FIG. 6 is a graph showing the composition ratio of GaP in the mixed InGaP crystal and the corresponding lattice constant of the mixed InGaP crystal, when mixed InGaP crystals are developed in the InGaP crystal growth method of the present invention.

Before looking into the compensating mechanism, lattice mismatching must be described with reference to a graph shown in FIG. 6. The lattice constant of InP is 5.8688Å whereas that of GaP is 5.4505Å. Accordingly, for the InGaP alloy crystals made of InP and GaP, the lattice constant is between 5.8688Å and 5.4505Å. Meanwhile, the lattice constant of GaAs used for the substrate is 5.6534Å. The lattice constant of the mixed InGaP crystal conforms to that of GaAs when the composition of the mixed crystal is such that the molar fraction of GaP "x" is 0.51. For material for visible light emitting elements, "x" must be larger than 0.51. As understood from the graph of FIG. 6, however, the lattice constant of the mixed crystal is smaller than that of GaAs when $x > 0.51$, resulting in lattice nonconformity.

One possible mechanism of compensating the lattice nonconformity in the crystal growth method of the present invention relies on the effect of Sn added as impurity. III–V group compounds such as InP, GaP and GaAs and mixed InGaP crystals provide zincblende crystal structures. According to the theory of chemical bond, the lattice constants of these compounds depend on the bond length between the III group atom and the V group atom. The bond length is known to conform virtually to the sum of the tetrahedral covalent radius (hereinafter referred to simply as covalent radius) of each III group atom and V group atom. According to the Table 7-1 on the page 224 in the revised version of "The Nature of The Chemical Bond" written by L. Pauling and translated by Masao Koizumi (published by Kyoritsu Shuppan, Aug. 10, 1964, 4th Edition), the covalent radii of elements involved in the present invention are as follows: P:1.10Å, As:1.18Å, Ga:1.26Å, In:1.44Å and Sn:1.40Å. Accordingly, the bond lengths of InP, GaP and GaAs are 2.54Å, 2.36Å and 2.44Å, respectively. For the mixed InGaP crystal in which In and Ga are mixed on a sub-lattice of the III group element, the mean body length is the sum of the covalent radius of P and the weighted mean of the covalent radii of Ga and In calculated taking into account of the composition ratio of the mixed crystal. Sn used as solvent in the crystal growth method of the present invention is a IV group element. As a so-called amphoteric impurity, it can be replaced with atoms on either the III group sub-lattice or the V group sub-lattice of a III–V group compound. When Sn is replaced with Ga on the Ga sub-lattice of GaP, for example, the bond length increases from 2.36Å of GaP to 2.50Å, the sum of the covalent radii of Sn and P. When Sn is replaced with P on the P sub-lattice, on the other hand, the bond length increases to 2.66Å. Thus, when Sn is added to GaP, the lattice constant of GaP increases with the bond length. In contrast, if Sn is added to InP, the bond length decreases slightly when Sn is replaced with In on the In sub-lattice, because the covalent radius of Sn (1.40Å) is smaller than that of In (1.44Å). When Sn is replaced with P on the P sub-lattice, the bond length increases substantially because the covalent radius of Sn is much larger than that of P. Therefore, the lattice constant of InP is also increased by adding Sn. Since this fact is true for InGaP, the mixed crystal of InP and GaP, the lattice constant of InGaP is also increased by adding Sn.

It should be understood from the above description that Sn added to the mixed InGaP crystal causes the lattice constant of the mixed crystal to increase. Now, description will be made on how the lattice mismatching between the GaAs substrate and the InGaP-growing layer is reduced by addition of Sn. As mentioned earlier, the composition of the target mixed InGaP crystal is such that "x" is larger than 0.51. In that case, the mixed InGaP crystal has a smaller lattice constant than GaAs. When mixed InGaP crystal of the above composition is grown on a GaAs substrate, deformation is generated on the surfaces of the substrate and of the InGaP layer due to the lattice mismatching. According to the crystal growth method of the present invention, Sn dissolved in the crystal growth solution is automatically added to InGaP, minimizing the surface energy, so that the lattice constant of InGaP is increased, thus reducing the lattice mismatching. Since deformation decreases as InGaP crystals are growing, the amount of Sn added decreases gradually until it reaches the normal value. In other words, the InGaP layer grown in the earliest stage behaves like a buffer layer with gradient lattice constant effected by addition of Sn, assumedly reducing the lattice mismatching between the GaAs substrate and the mixed InGaP crystal layer of the specified composition.

Another possible mechanism of compensating the lattice mismatching between the GaAs substrate and the InGaP-growing layer by addition of Sn is as follows.

In the earlier stage of crystal growth, numerous insular InGaP micro crystals of the same orientation as the GaAs substrate are developed on the GaAs substrate. As the lateral growth of crystals is accelerated by these micro crystals developed as cores, the insular micro crystals grow until they meet, thus forming a InGaP layer of single crystal. The InGaP layer continues growing until an epitaxially growing layer of a specified thickness is formed. The irregular lattice dislocation due to the lattice constant mismatching between the GaAs substrate and the InGaP-growing layer is not transmitted to the InGaP-growing layer because it is short-circuited through the interface of the substrate and the layer. As a result, InGaP layer of high quality is obtained.

Thus, in the crystal growth method of the present invention, InGaP-growing layer of high quality is obtained presumably because the lattice unconformity is reduced by at least one of the two mechanisms described above.

And this is why the crystal growth method of the present invention permits epitaxial growth of mixed InGaP crystals directly on the GaAs substrate. The same effect as obtained by Sn as a solvent can be expected if Sn is replaced by Pb or Bi, although Sn is more advantageous as a solvent, considering that residual Sn solution, if any, on the surface of the growing layer can be easily removed by a chemical etching with such solution as hydrochloric acid.

DETAILED DESCRIPTION OF THE INVENTION

The material for a light emitting element of the present invention is described below in detail with reference to the accompanying drawings.

Figure 1:
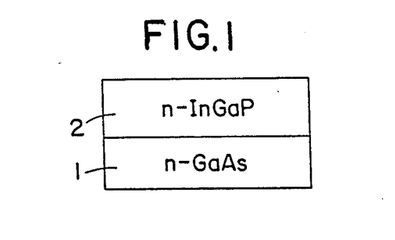
FIG. 1 is a sectional view of a material for light emitting element of the first embodiment of the present invention.

FIG. 1 shows the first embodiment of the material of the present invention. The material of the first embodiment provides a two-layered structure comprising a Sn-doped n-type InGaP layer 2 grown on an n-type GaAs substrate 1. The InGaP layer 2 is formed directly on the GaAs substrate 1 without forming therebetween a $GaAs_yP_{1-y}$ gradient layer for coordinating the lattice constant.

Figure 2:
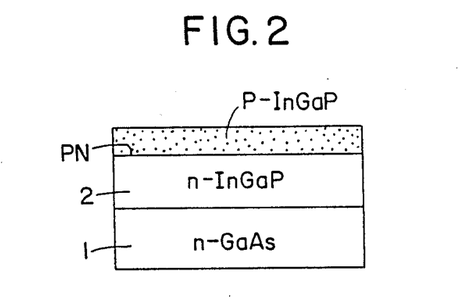
FIG. 2 is a sectional view of the second embodiment of the invention.

FIG. 2 shows the second embodiment of the present invention in which a p-type InGaP layer is developed by diffusing, say, Zn into the Sn doped n-type InGaP layer 2 of the first embodiment so that a luminous area including a p-n junction PN is formed in the layer 2.

Figure 3:
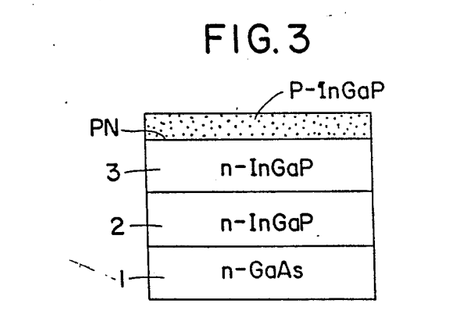
FIG. 3 is a sectional view of the third embodiment of the invention.

The material of the third embodiment shown in FIG. 3 provides a three-layered structure comprising a Te doped n-type InGaP layer 3 of the better crystal quality than the Sn doped n-type InGaP layer 2 grown on the Sn doped n-type InGaP layer 2. Like the second embodiment, a p-n junction PN is formed in the Te doped n-type InGaP layer 3.

Figure 4:
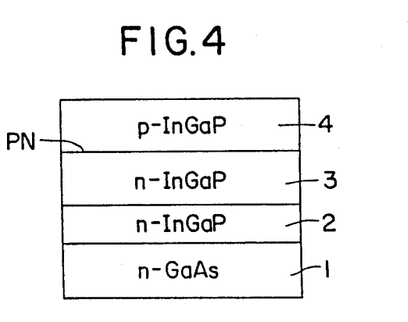
FIG. 4 is a sectional view of the fourth embodiment of the invention.

The material of the fourth embodiment, as shown in FIG. 4, provides a four-layered structure in which a Zn doped p-type InGaP layer 4 of the better crystal quality than the InGaP layer 2 is grown on the Te doped n-type InGaP layer 3, with a p-n junction PN formed between the InGaP layer 3 and the InGaP layer 4.

As mentioned previously, in any of the materials of the first to the fourth embodiments of the present invention, the mixed crystal composition of the Sn doped, Te doped and Zn doped InGaP layers 2, 3 and 4 is controlled so that the molar fraction of GaP becomes 0.50 to 0.75, and a gradient layer for coordinating the lattice constant is not provided between the substrate 1 and the InGaP layer 2. Therefore, the material of the present invention is simpler in construction and lower in cost than the conventional material with a gradient layer. If this material is used for producing a green light emitting diode (LED) with a p-side and an n-side electrode elements provided by, say, vacuum evaporation, the manufacturing cost of the LED can be lowered. Needless to say, LED made from the material of the present invention is free from misfit dislocation attributable to the GaAsP gradient layer.

Now, the process of manufacturing the material of four-layered structure of the fourth embodiment in the crystal growth method of the present invention is described specifically in the following.

Figure 5:
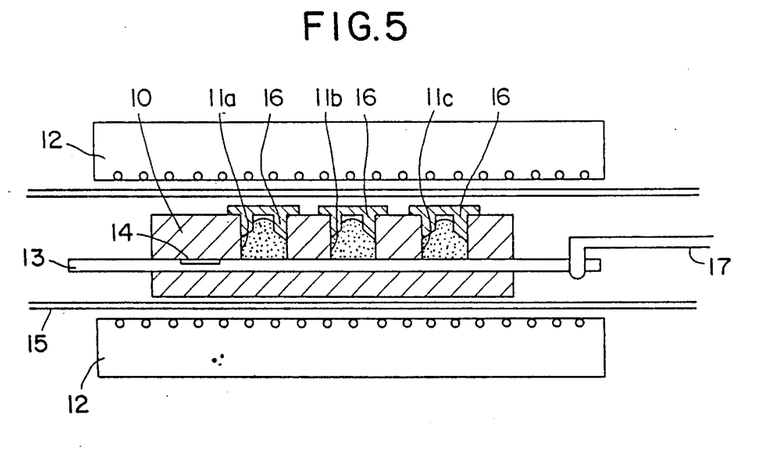
FIG. 5 is a schematic sectional view of a crystal growing apparatus to be used in producing the material of the present invention.

An n-type GaAs substrate with the crystal face orientation in (100) or (111)B, 400 to 500 μm in thickness and $10^{17}$ to $10^{18}/cm^3$ in carrier concentration is prepared. The surface of the substrate is ground with a No. 3,000 Carborundum and then mirror-finished by grinding with alumina powder with grain size changed from 1 μm to 0.3 μm and to 0.05 μm. Then the GaAs substrate is immersed about 5 to 7 min. in an etching solution composed of undiluted sulfuric acid, water and hydrogen peroxide mixed by the ratio of 3:1:1 in the volume percent, to remove the machined layer on the GaAs substrate surface. The substrate is then washed thoroughly with distilled water and finally with acetone of high purity and allowed to dry. The GaAs substrate thus obtained is set on a slider 13 of a crystal growing apparatus shown in FIG. 5. Specified quantities of Sn, InP and GaP cleaned by chemical etching and washing are put in a solution bin 11a in a slide boat 10. Similarly, specified quantities of In, InP, GaP and, say,Te as a donor impurity are put in a solution bin 11b as source material for growing an n-type InGaP layer, the third layer. Specified quantities of In, InP, GaP and, say, Zn as an acceptor impurity are put in a solution bin 11c as source material for growing a p-type InGaP layer, the fourth layer. Alternatively, Sn-In-Ga-P alloy, In-Ga-P(Te) alloy and In-Ga-P(Zn) alloy may be put in the solution bins 11a, 11b and 11c, respectively, if the elements of each alloy are mixed sufficiently in advance by using an appropriate method. (Te) and (Zn) indicate that the In-Ga-P alloy contains trace amount of Te or Zn. The specific quantities of components to be put for growing each layer is as follows:

2nd Sn doped n-type InGaP layer
  Sn: 3.0 g, InP: 0.12 g, GaP: 0.81 g
3rd Te doped n-type InGaP layer
  In: 3 g, InP: 65 mg, GaP: 40 mg, Te: 0.1 to 10 mg
4th Zn doped p-type InGaP layer
  In: 3 g, InP: 65 mg, GaP: 40 mg, Zn: 1 to 30 mg After these growth solutions are put in the respective solution bins, a lid 16 is placed on each solution bin to prevent phosphorus and impurities from vaporizing.

The slide boat 10 is placed in a quartz tube 15 through which inert gas such as highly pure nitrogen or argon or highly pure hydrogen gas in allowed to blow, to ensure that there is no oxygen and $H_2O$ vapor left in the tube 15. The hydrogen gas to be used for this purpose should be purified by passing a paradium film or other appropriate means in advance. After purging sufficiently, the growth solutions for the layers are heated by an electric furnace 12 to a temperature a little higher or specifically 10° to 50° C. higher than the crystal-growing temperature for each layer, and maintained at this temperature for a specified period (say, two to four hours). Thus, the homogeneous growth solution for each layer is obtained. Then, the growth solutions are cooled gradually at an appropriate rate (0.2° to 0.5° C./min) to, say, 820° C. at which the second layer starts growing. At this time, InGaP is saturated or somewhat supersaturated in the Sn solution for the second layer. With this state, the slider 13 is moved by a slider operating rod 17 until the GaAs substrate 14 comes immediately under the solution bin 11a, causing the GaAs substrate 14 to come in contact with the growth solution in the bin 11a. In GaP, supersaturated in the growth solution being cooled gradually at an appropriate rate of 0.2° to 0.5° C./min, is precipitated on the GaAs substrate 14 whereby the Sn doped n-type InGaP layer 2 is developed. When the layer 2 has grown to a certain thickness, say 10 μm, the slider 13 is moved to position the GaAs substrate 14 immediately under the solution bin 11b, to allow the third Te doped n-type InGaP layer 3 to be developed. When the layer 3 has grown to a certain thickness, say, 5 μm, the slider 13 is moved again until the GaAs substrate 14 comes immediately under the solution bin 11c so that the fourth Zn doped p-type InGaP layer 4 starts growing. When the layer 4 has grown to a specified thickness, the slider 13 is moved to separate the growth solution in the solution bin 11c from the surface of the p-type InGaP growing layer, so that the layer stops growing. Thus, the Sn doped n-type InGaP layer 2, the Te doped n-type InGaP layer 3 and the Zn doped p-type InGaP layer 4 are developed in this order on the substrate 14. Each of these layers provides the specified mixed InGaP crystal composition. The Sn doped n-type InGaP layer 2, for instance, contains 70 mol% of GaP.

As mentioned earlier, the InGaP crystals can be developed without forming on the GaAs substrate a $GaAs_yP_{1-y}$ gradient layer for coordinating the lattice constant. According to the crystal growth method of the present invention, the lattice constants of GaAs, InP and GaP are, as shown in FIG. 6, 5.6534Å, 5.8688Å and 5.4505Å, respectively. The lattice constant of the InGaP mixed crystal (alloy crystal of InP and GaP), in which the molar fraction of GaP in InGaP is 0.50 to 0.75 (shaded portion in FIG. 6), is equal to or smaller than 5.6534Å, the lattice constant of GaAs. In the range where the molar fraction of GaP is 0.70 to 0.74 as is crucial for green light emission, the lattice constant of the GaAs substrate does not conform to that of the InGaP growing layer. Nevertheless, the crystal growth method of the present invention permits InGaP layers of high quality to grow on the GaAs substrate due to the advantageous effects of the Sn solvent as described previously.

The material of the first embodiment shown in FIG. 1 is obtained by developing an Sn doped n-type InGaP layer 2 on a GaAs substrate 14. The material of the second embodiment shown in FIG. 2 is obtained by diffusing an acceptor impurity (most preferably Zn) into the InGaP layer 2 of the first embodiment to form a p-n junction PN-containing luminous region in the layer 2. The material of the third embodiment shown in FIG. 3 is obtained by developing a Te doped n-type InGaP layer 3 on the InGaP layer 2 of the first embodiment and diffusing Zn into the InGaP layer 3 to form a p-n junction PN in the layer 3.

Figure 7A:
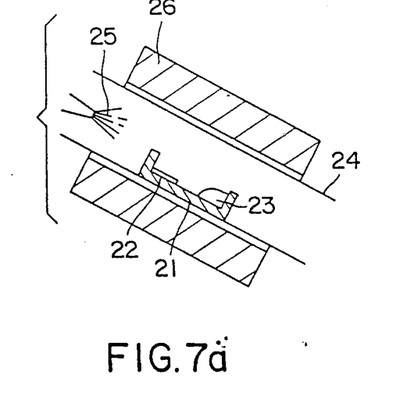
FIGS. 7(a) and 7(b) are schematic sectional views of other crystal growing apparatus to be used in producing the material of the present invention.
Figure 7B:
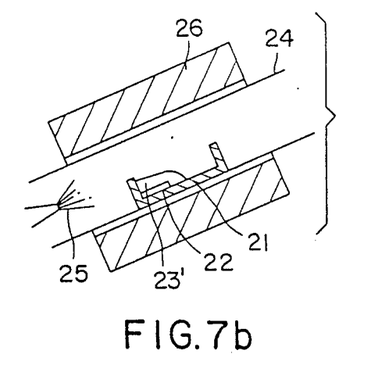

The above example of manufacturing method is called the slide boat method in which a slide boat is used as an production device. As another manufacturing method, the tipping method is described now by referring to the case of manufacturing the material of two-layered structure shown in FIG. 1. In the tipping method, a production apparatus is inclined in order to move the solution, allowing the solution to come in contact with or separate from a substrate, thereby controlling the development of semiconductor crystals. The apparatus used for this production is shown in FIGS. 7(a) and 7(b).

First, an n-type GaAs substrate of the crystal face orientation in (100), about 500 $\mu$m in thickness and $10^{17}$ to $10^{18}$/cm$^3$ in carrier concentration is prepared. The surface of the substrate is ground with a No. 3,000 Carborundum and mirror-finished by grinding with alumina powder with grain size changed from 1 $\mu$m to 0.3 $\mu$m and to 0.05 $\mu$m. Then the GaAs substrate is immersed about 5 to 7 min. in an etching solution composed of undiluted sulfuric acid, water and hydrogen peroxide mixed by the ratio of 3:1:1 in the volume percent, to remove the machined layer on the GaAs substrate surface. The substrate is then washed thoroughly with distilled water and finally with acetone of high purity and allowed to dry. The substrate thus obtained is placed as a seed crystal substrate 22 in a boat 21 of a crystal growing apparatus as shown in FIG. 7(a). A solution material 23 composed of 0.12 g of InP and 0.81 g of GaP dissolved in 3 g of Sn is put in the boat 21 placed in a quartz tube 24. Hydrogen gas 25 passed through a paradium film is allowed to flow through the quartz tube 24 while the tube 24 is heated by an electric furnace 26 to 820° C. to prepare a solution 23"The quartz tube 24 is inclined to make the solution 23' cover the seed crystal substrate 22 as shown in FIG. 7(b). The temperature is then lowered at the rate of about 0.2° C./min., to permit crystals to start growing. The InGaP crystal layer thus obtained is about 15$\mu$m thick, has the same crystal orientation as the GaAs substrate, and provides the mixed crystal composition "x"=0.70.

As a modification of the above example, a solution 23' is prepared from a solution material 23 composed of 60 mg of InP and 32 mg of GaP dissolved in 3 g of Sn. With the crystal growth starting temperature at 800° C., InGaP crystal is developed by using the apparatus shown in FIGS. 7(a) and 7(b). The InGaP crystal layer thus obtained is about 10$\mu$m thick and provides the mixed crystal composition "x"=0.72.

Figure 8:
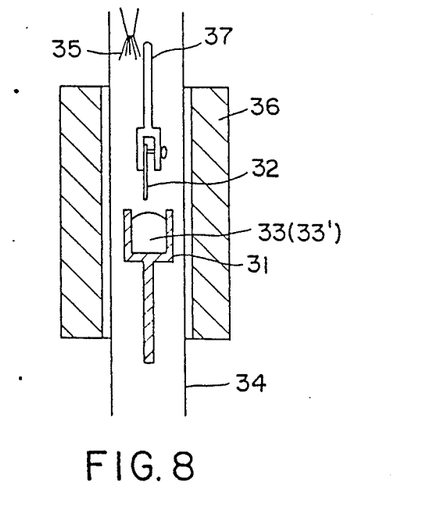
FIG. 8 is a schematic sectional view of another crystal growing apparatus to be used in producing the material of the present invention.

As another manufacturing method, the dipping method is described for the material of two-layered structure. In this method, a substrate is dipped in a solution containing source materials to allow an epitaxial crystal layer to grow on the substrate. FIG. 8 shows an apparatus for use in this method. A vertical electric furnace 36 is built in the apparatus. A solution material 33 is put in a crucible 31, whereas a seed crystal substrate 32 is secured to the end of a supporting rod 37 which is vertically movable. A solution 33' is prepared by heating the solution material 33 to a temperature at which crystals start growing. The seed crystal substrate 32 is heated to a temperature a little lower than that of the solution 33'. When the temperature of the entire substrate 32 has reached the specified value, the supporting rod 37 is moved downward to make the substrate 32 dip in the solution 33' Since the seed crystal substrate 32 is cooler than the solution 33', the heat of the solution 33' at the contact surface is transferred to the substrate 32. As a result, the temperature of the solution 33' at the contact surface drops, causing InGaP to be supersaturated and precipitated on the seed crystal substrate 32. InGaP crystal begins growing in this way. Development of crystals continues until the temperature of the solution 33' becomes equal to that of the substrate 32.

The Sn doped InGaP layer obtained as the second layer in any of the above manufacturing methods contains Sn as impurity. Therefore, the InGaP crystal provides n-type conduction. The conduction type and the carrier concentration can be controlled as desired by adding an appropriate impurity to the growth solution. For instance, the donor concentration attributed to Sn can be compensated and the conduction type can be reversed to p-type by adding an acceptor. Inversely, addition of donor can increase the donor concentration. Carrier concentration of the Sn doped layer can be controlled by adding such metal with deep level impurity as 0, Cu, Ag, Cr, Fe or Co to the growth solution.

Any of n-n, p-n, n-p and p-p junctions is easily obtained between GaAs and InGaP by adding adequate quantity of appropriate impurity and by selecting GaAs crystal of appropriate conduction type as a seed crystal substrate.

In the above embodiments, the crystal face (100) or (111) of GaAs is used for a seed crystal substrate. Any other crystal face may be used as desired. Polycrystal may be used. If a GaP substrate manufactured before is at hand, it may be used as a seed crystal substrate. It is not to mention that an InGaP crystal produced in the crystal growth method of the present invention may be used as a substrate.

As described above, the material for light emitting element of the present invention provides an at least two-layered structure composed of a GaAs substrate and a Sn doped InGaP layer which does not require a gradient layer. With this structure as a base, a donor impurity doped InGaP layer may be developed on the Sn doped InGaP layer to form a three-layered structure. An acceptor impurity doped InGaP layer may be further developed on the donor impurity doped InGaP layer to form a four-layered structure. Regardless of the structure of the material, the mixed crystal composition of the Sn doped, donor impurity doped and acceptor impurity doped InGaP layers is within the range of 0.50 to 0.75 when expressed by the molar fraction of GaP. With the mixed InGaP crystal epitaxially grown directly on the GaAs substrate, the material of the present invention involves less labor in production and therefore is lower in production cost than the conventional material containing a gradient layer. Accordingly, the production cost of a light emitting element such as LED, laser diode or avalanche photo diode for optical communication can be lowered if they are manufactured from the material of the present invention.

Furthermore, according to the crystal growth method of the present invention which uses the growth solution prepared by dissolving GaP and InP in Sn solvent so that the molar fraction of GaP in the mixed InGaP crystal becomes 0.50 to 0.75, InGaP crystals can be epitaxially growth directly on the GaAs substrate without providing a gradient layer on the substrate. Besides, the GaAs substrate is not dissolved in the solution during the epitaxial growth of crystals. Moreover, the direction of the GaAs crystal face for epitaxial crystal growth is not limited. As a result, materials for yellow to green light emitting element of high quality and of low dislocation density can be produced at a low cost.

What is claimed is:

1. A material for a light emitting element of at least a two-layered structure comprising a gallium arsenide (GaAs) substrate and a tin (Sn) doped indium gallium phosphide (InGaP) layer whose mixed crystal composition expressed by the molar fraction (x) of gallium phosphide (GaP) is 0.63 to 0.74, wherein a solution comprising Sn as a solvent is used in forming an sn doped InGaP layer on the GaAs substrate.

2. The material for a light emitting element of claim 1, wherein said Sn doped InGaP layer includes a p-n junction.

3. The material for a light emitting element of claim 1, further comprising a donor impurity doped InGaP layer developed on said Sn doped InGap layer to provide an at least three-layered structure, the mixed crystal composition of said donor impurity doped InGaP layer as expressed by the molar fraction of GaP being 0.63 to 0.74, said donor impurity doped InGaP layer including a p-n junction.

4. The material for a light emitting element of claim 1, further comprising a donor impurity doped InGaP layer and an acceptor impurity doped InGaP layer to provide an at least four-layered structure, the mixed crystal composition of said donor impurity doped and acceptor impurity doped InGaP layers as expressed by the molar fraction of GaP being 0.63 to 0.74.

* * * * *